(12) United States Patent
Chang et al.

(10) Patent No.: US 7,453,968 B2
(45) Date of Patent: Nov. 18, 2008

(54) DYNAMIC PHASE ALIGNMENT METHODS AND APPARATUS

(75) Inventors: Richard Yen-Hsiang Chang, Bloomfield, NJ (US); Gregory Starr, San Jose, CA (US)

(73) Assignee: Altera Corporation, San Jose, CA (US)

( * ) Notice: Subject to any disclaimer, the term of this patent is extended or adjusted under 35 U.S.C. 154(b) by 765 days.

(21) Appl. No.: 10/849,319

(22) Filed: May 18, 2004

(65) Prior Publication Data

US 2005/0259775 A1 Nov. 24, 2005

(51) Int. Cl.
*H04L 7/00* (2006.01)
*H03D 3/24* (2006.01)
*H03L 7/06* (2006.01)

(52) U.S. Cl. .................. 375/355; 375/376; 327/156

(58) Field of Classification Search .................. 375/354, 375/355, 371, 373, 375, 376, 359; 327/100, 327/141, 144, 147, 156, 365, 407, 291, 298
See application file for complete search history.

(56) References Cited

U.S. PATENT DOCUMENTS

| | | | | |
|---|---|---|---|---|
| 5,081,655 | A | * | 1/1992 | Long ........................ 375/373 |
| 5,574,756 | A | | 11/1996 | Jeong |
| 6,041,090 | A | * | 3/2000 | Chen ........................ 375/376 |
| 6,104,228 | A | * | 8/2000 | Lakshmikumar ............ 327/407 |
| 6,266,799 | B1 | | 7/2001 | Lee et al. |
| 6,650,140 | B2 | | 11/2003 | Lee et al. .................... 326/39 |
| 6,724,328 | B1 | | 4/2004 | Lui et al. .................... 341/101 |
| 6,750,675 | B2 | | 6/2004 | Venkata et al. .............. 326/41 |
| 2001/0033188 | A1 | | 10/2001 | Aung et al. ................. 327/141 |
| 2002/0090045 | A1 | | 7/2002 | Hendrickson |
| 2003/0167417 | A1 | * | 9/2003 | To et al. ...................... 713/500 |
| 2004/0140837 | A1 | | 7/2004 | Venkata et al. .............. 327/235 |

FOREIGN PATENT DOCUMENTS

EP 0317159 5/1989

OTHER PUBLICATIONS

U.S. Appl. No. 10/059,014, filed Jan. 29, 2002, Lee et al.
U.S. Appl. No. 10/273,899, filed Oct. 16, 2002, Venkata et al.
U.S. Appl. No. 10/317,262, filed Dec. 10, 2002, Venkata et al.
U.S. Appl. No. 10/637,982, filed Aug. 8, 2003, Venkata et al.
U.S. Appl. No. 10/668,900, filed Sep. 22, 2003, Asaduzzaman et al.
U.S. Appl. No. 10/672,901, filed Sep. 26, 2003, Asaduzzaman et al.
U.S. Appl. No. 10/713,877, filed Nov. 13, 2003, Churchill et al.
U.S. Appl. No. 10/722,665, filed Nov. 26, 2003, Wortman et al.

* cited by examiner

*Primary Examiner*—Khai Tran
(74) *Attorney, Agent, or Firm*—Ropes & Gray LLP; Robert R. Jackson

(57) ABSTRACT

Dynamic phase alignment circuitry selects from among several, phase-distributed, candidate clock signals the one of those signals that is currently best for use in controlling the timing of sampling of a serial data signal to recover the data from that signal. The circuitry selects two phase-adjacent ones of the candidate clock signals that are currently the two best candidates for final selection. The circuitry makes a final selection of the generally better one of these two best candidates in a way that avoids unproductive switching back and forth between these two best candidates.

32 Claims, 5 Drawing Sheets

| CURRENT PHASE NET COUNT | NEXT PHASE NET COUNT | "WINNER" | ACTION WITH RESPECT TO CURRENT PHASE OR LOCK |
|---|---|---|---|
| UP | UP | EITHER | INCREASE PHASE |
| DN | DN | EITHER | DECREASE PHASE |
| UP | DN | NEXT PHASE | LOCK |
| UP | DN | CURRENT PHASE | INCREASE PHASE |
| DN | UP | NEXT PHASE | LOCK |
| DN | UP | CURRENT PHASE | DECREASE PHASE |

FIG. 3

DYNAMIC PHASE ALIGNMENT METHODS AND APPARATUS

BACKGROUND OF THE INVENTION

This invention relates to methods and apparatus for processing a received serial data signal, and more particularly to methods and apparatus for determining the phase of such a signal so that it can be reliably sampled to recover its data content.

Receiver circuitry may receive a serial data signal with no accompanying information about the timing of the individual data bits in that signal. This timing information is sometimes referred to as the phase of the signal. The receiver circuitry must recover the data from the received signal. To do this, the receiver circuitry needs to sample the received signal during each data bit interval ("unit interval") in that signal to determine whether the signal currently represents a binary 1 or a binary 0. Information about the phase of the signal is needed so that the signal can be sampled at a time during each unit interval that will give reliable results. For example, it may be desired to sample the signal as close to the center of each unit interval as possible. Because the data signal is not received with any accompanying phase information, the receiver circuitry itself must derive the phase information it needs from the received data signal. The process of determining the phase of a received data signal may be referred to as phase alignment; and because the phase of the received signal may change over time, the phase alignment may need to be dynamic to keep the results current at all times.

A known dynamic phase alignment ("DPA") technique includes producing several candidate clock signals, all of which have the same frequency (related to the frequency of the received data signal), and each of which has a unique phase. For example, there may be eight candidate clock signals, the phases of which are equally spaced over one clock signal cycle. Phase detector circuitry is used to compare the phase of transitions in the received data signal to the phase of transitions in one of the candidate clock signals. Assuming the phase detector does not detect a perfect phase match (as it almost never does), the phase detector circuitry keeps moving from one candidate clock signal to the next trying to find the candidate signal having the phase that will be best for use in timing the sampling of the data signal.

Typically the phase detector circuitry quickly finds what it regards as currently the best (or at least a very good) candidate clock signal for use in controlling data signal sampling. But continued operation of the phase detector circuitry also typically causes it to switch to a different candidate clock signal as it continues to search for the best such signal to use. The new choice may in fact be somewhat better or somewhat worse than the old choice. In either case, as long as there is still some phase mismatch, the search for the best signal continues, which may cause the phase detector to soon revert to its previous choice. In other words, even when the system is effectively at convergence, continued searching for a better candidate clock signal to use may cause the system to unproductively bounce back and forth between two choices, one of which may be better than the other, but either of which can be used with acceptably good results. Although systems having the foregoing characteristic can operate very well, the above-described bouncing or hunting can be undesirable. For example, it can increase noise in the system, and it can cause data signal interpretation errors that might not otherwise occur.

Examples of phase detector systems of the type described above are shown in such references as Aung et al. U.S. patent application Ser. No. 09/805,843, filed Mar. 13, 2001, Lee et al. U.S. patent application Ser. No. 10/059,014, filed Jan. 29, 2002, Lee et al. U.S. Pat. No. 6,650,140, Venkata et al. U.S. patent application Ser. No. 10/195,229, filed Jul. 11, 2002, Venkata et al. U.S. patent application Ser. No. 10/273,899, filed Oct. 16, 2002, Venkata et al. U.S. patent application Ser. No. 10/317,262, filed Dec. 10, 2002, Lui et al. U.S. patent application Ser. No. 10/454,626, filed Jun. 3, 2003, Venkata et al. U.S. patent application Ser. No. 10/349,541, filed Jan. 21, 2003, Venkata et al. U.S. patent application Ser. No. 10/637,982, filed Aug. 8, 2003, Asaduzzaman et al. U.S. patent application Ser. No. 10/668,900, filed Sep. 22, 2003, and Asaduzzaman et al. U.S. patent application Ser. No. 10/672,901, filed Sep. 26, 2003. These references also show examples of systems that can be modified in accordance with the principles of the present invention (e.g., to include the phase detector circuitry of this invention in place of the prior phase detector circuitry).

SUMMARY OF THE INVENTION

Dynamic phase detector circuitry in accordance with this invention selects two phase-adjacent clock signals from a plurality of phase-distributed candidate clock signals. Different such selections may be made until it is found that transitions in the two selected clock signals are predominantly on respective opposite sides of transitions in the serial data signal with which phase alignment is desired. One of the two selected clock signals is further selected for use in controlling the timing with which the serial data signal is sampled to recover data from that signal. The consistency with which the two selected clock signals continue to have transitions on their respective opposite sides of the transitions in the serial data signal is monitored separately for each of the two selected signals. Different consistency measure thresholds are preferably used for each of the two signals, with the signal that is further selected for use in controlling the timing of data signal sampling preferably having the greater threshold value. As long as both of the two selected signals continue to have transitions that are predominantly on their respective opposite sides of the serial data signal transitions, and as long as the consistency measure threshold for the further selected signal is not reached before the consistency measure threshold for the other of the two selected signals is reached, no change is made in any of the clock signal selections. In addition, a lock output signal may be produced under these conditions to indicate that the dynamic phase alignment is stable.

Further features of the invention, its nature and various advantages, will be more apparent from the accompanying drawings and the following detailed description.

BRIEF DESCRIPTION OF THE DRAWINGS

FIG. 3 is a table showing illustrative modes of operation of circuitry of the type shown in FIG. 2 in accordance with the invention.

DETAILED DESCRIPTION

Figure 1:
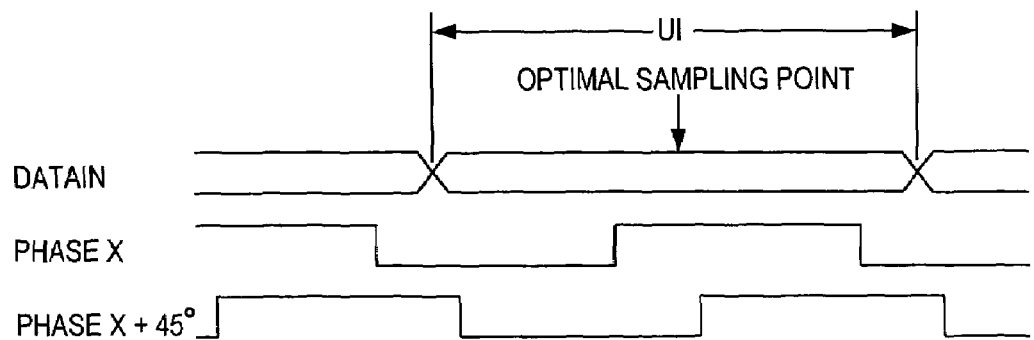
FIG. 1 shows illustrative signal waveforms (all plotted along a common horizontal time scale) that are useful in explaining the invention.

FIG. 1 illustrates typical and representative signal conditions that can occur in either the prior systems mentioned in the background section of this specification or in a system in accordance with this invention. A serial data signal DATAIN represents successive bits of data. Each bit of data occupies one "unit interval" or "UI" in the data signal. The data signal does not necessarily transition (change in level) at the beginning and end of each UI, but all transitions in the data signal level are at the boundaries between UIs. In FIG. 1 both possible levels of DATAIN are shown for each UI, and the boundaries between UIs are indicated by the crosses to show where transitions can occur. Only one complete UI is shown in FIG. 1, but it will be understood that this UI is preceded and followed by many other UIs in what is typically a long series of UIs, each of which is immediately adjacent to the preceding and following UIs in the series.

FIG. 1 indicates the "optimal sampling point" for the representative UI shown in that FIG. In the particular example shown in FIG. 1 the optimal sampling location is indicated to be the center of each UI. It will be understood, however, that in other systems the optimal sampling point may be somewhat earlier or somewhat later than the center of each UI. Any desired optimal sampling point can be accommodated by the present invention.

FIG. 1 also shows two representative candidate clock signals on the same horizontal time axis as DATAIN. These two candidate clock signals are labelled "Phase X" and "Phase X+45°", respectively. The Phase X and Phase X+45° signals are two phase-adjacent ones of eight candidate clock signals. All of these signals have the same frequency, which in this example is equal to the bit rate of the DATAIN signal. Each of the eight candidate clock signals has a phase that is different from the phases of all of the other ones of those signals. These eight different phases are preferably equally distributed over one cycle of any one of the candidate clock signals. Thus the phase difference between any two phase-adjacent candidate clock signals is 45° in this example. Although eight signals with 45° phase spacing are employed in the illustrative embodiment shown and described herein, it will be understood that any number of such signals having any suitable phase spacing can be used instead if desired.

In some prior phase alignment systems phase detector circuitry is used to compare the phase of transitions in the DATAIN signal with the phase of transitions in candidate clock signals like those described above, taking the candidate signals one at a time. The objective is to find the one candidate clock signal having the phase that makes it best for use in timing the sampling of DATAIN to extract the data information from that signal. In the example shown in FIG. 1 the prior phase detector circuitry may compare the phase of falling edges in a candidate clock signal with the phase of UI boundaries in the DATAIN signal. The candidate clock signal having falling edges that are closest in phase to UI boundaries has rising edges that are closest to the center of the UIs. In the particular case shown in FIG. 1, the Phase X+45° signal has falling edges that are closest in phase to UI boundaries in DATAIN. The rising edges in Phase X+45° are therefore closest to the center of the UIs and thus have the best timing for use in controlling sampling of DATAIN.

After selecting Phase X+45° for use in controlling sampling of DATAIN, the above-described prior phase detector circuitry will, however, continue to detect that the falling edges in Phase X+45° are actually somewhat later in time or phase than the UI boundaries in DATAIN. Eventually this will cause phase alignment circuitry of the above-described prior type to switch to the phase-adjacent candidate clock signal whose falling edges are earlier in time or phase than the UI boundaries in DATAIN. This means switching from Phase X+45° to Phase X as the signal selected for controlling the timing of DATAIN signal sampling. Although probably still an acceptable choice, Phase X is not as good a choice as Phase X+45° because the positive-going transitions in Phase X are farther from the center of UI than the positive-going transitions in Phase X+45°.

After operating with Phase X for some time, the fact that negative-going transitions in Phase X are ahead of UI boundaries in DATAIN will cause the above-described prior phase alignment circuitry to switch back to using Phase X+45° as the signal for controlling-sampling of DATAIN.

The above-described prior phase alignment circuitry will continue to switch back and forth between Phase X+45° and Phase X indefinitely (assuming that the UI boundaries in DATAIN remain between falling edges in these two candidate clock signals). This switching back and forth serves no useful purpose, and it may have such disadvantages as increasing noise in the system and increasing the risk of false interpretation of bits in DATAIN.

Figure 2:
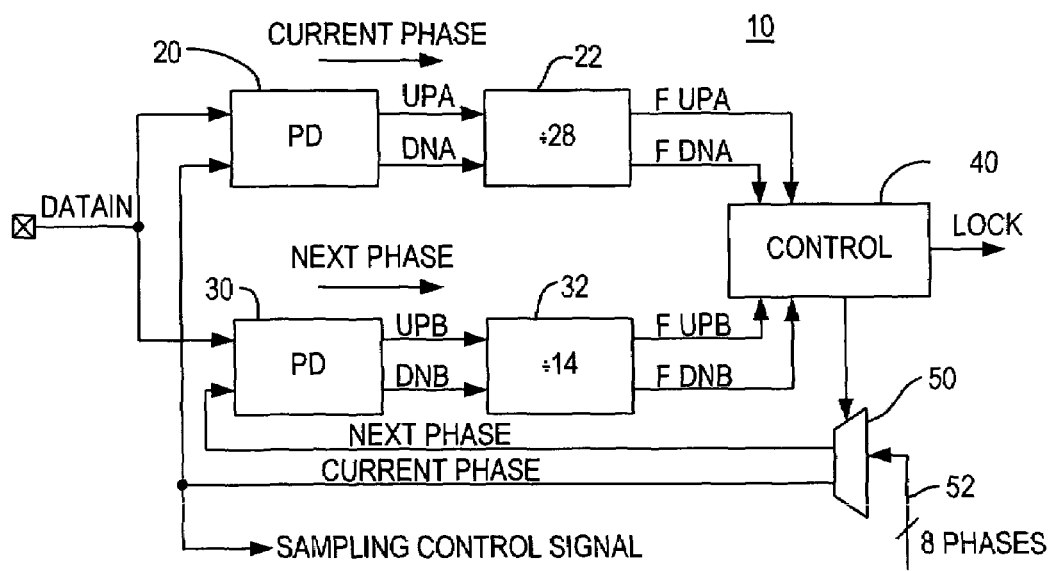
FIG. 2 is a simplified schematic block diagram showing illustrative circuitry constructed in accordance with the invention.

Illustrative dynamic phase alignment ("DPA") circuitry 10 in accordance with the present invention is shown in FIG. 2. This circuitry includes two phase detector circuits 20 and 30. Each of phase detector circuits 20 and 30 receives the DATAIN signal via one of its inputs. The other input to phase detector 20 is the candidate clock signal currently being used to control sampling of DATAIN. This candidate clock signal is sometimes referred to herein as the "current phase" signal. The other input to phase detector 30 is the candidate clock signal (sometimes referred to as the "next phase" signal) that is adjacent in phase to the current phase signal and that the current phase circuitry (elements 20 and 22) are pointing to as a possibly (although not necessarily) better choice for use in controlling sampling of DATAIN. (The manner in which this "pointing" is done will be explained later in this specification.) For example, in the situation illustrated by FIG. 1, the current phase signal might be Phase X+45°, in which case the next phase signal would be Phase X.

If phase detector 20 detects that a transition in DATAIN is later in time than a negative-going transition in the current phase signal, circuitry 20 outputs an "up" signal pulse on its UPA output lead to indicate that a better phase match might be achieved by selecting as the current phase signal the candidate clock signal having greater phase angle than the candidate clock signal currently selected as the current phase signal. Conversely, if phase detector 20 detects that a transition in DATAIN is earlier in time than a negative-going transition in the current phase signal, circuitry 20 outputs a "down" signal pulse on its DNA output lead to indicate that a better phase match might be achieved by selecting as the current phase signal the candidate clock signal having a lower phase angle than the candidate clock signal currently selected as the current phase signal.

Circuitry 22 may be counter and divider circuitry. Circuitry 22 counts up in response to each UPA pulse produced by circuitry 20. Circuitry 22 counts down in response to each DNA pulse. The count contained by circuitry 22 at any given time during counting operation of that circuitry is thus the net of the UPA and DNA pulses it has received since it was last reset. Circuitry 22 produces an output signal on an F UPA output lead whenever the net count contained in circuitry 22 is 28 UPA pulses. Circuitry 22 produces an output signal on an F DNA output lead whenever the net count contained in circuitry 22 is 28 DNA pulses. The counter in circuitry 22 may be reset to a neutral starting count each time such an F UPA or F DNA output signal is produced. A counter in circuitry 32 (described in more detail below) is also reset whenever the counter in circuitry 22 is reset.

Elements 30 and 32 are constructed and operate similarly to what has been described above. Circuitry 30 produces an UPB or DNB output pulse whenever a transition in DATAIN is later or earlier, respectively, than a negative-going transition in the next phase signal. Circuitry 32 forms a net count of the UPB and DNB pulses and outputs an F UPB or F DNB signal whenever the net count contained in circuitry 32 is 14 UPB or DNB pulses, respectively. Again, the counter in circuitry 32 may be reset to a neutral starting count each time such an F UPB or F DNB output signal is produced. The counter in circuitry 32 may also be reset at other times, such as whenever the counter in circuitry 22 is reset.

The integration operations performed by elements 22 and 32 (e.g., forming net counts of the up and down pulses and then requiring the net counts to reach thresholds of 28 or 14 before producing any further output signals) prevent the system from trying to be too responsive to phase differences between DATAIN and the candidate clock signals applied to elements 20 and 30. In addition, the use of different thresholds in elements 22 and 32 (especially the use of a smaller threshold (e.g., 14) in element 32 than in element 22 (e.g., 28)) helps make the system more likely to lock on one phase than to switch arbitrarily between two phases as will be shown below. This further improves the stability of the system in accordance with the invention. (Later in this specification it will be explained that the difference in the thresholds mentioned above may not actually be as great as the difference between 28 and 14.)

Figure 4A:
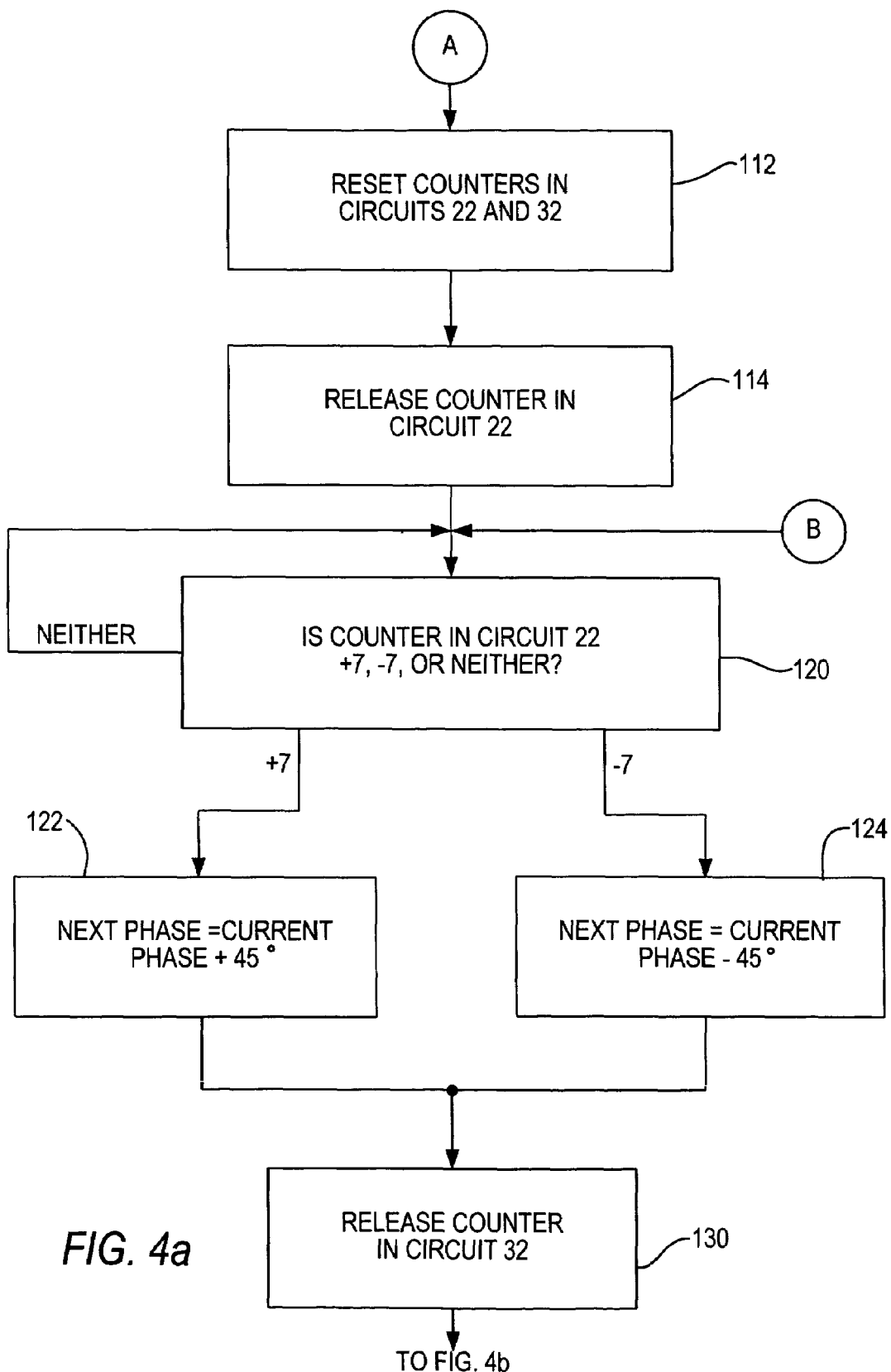
FIGS. 4a-4b are collectively a simplified flow chart showing further illustrative aspects of operation of circuitry of the type shown in FIG. 2 in accordance with the invention.
Figure 4B:
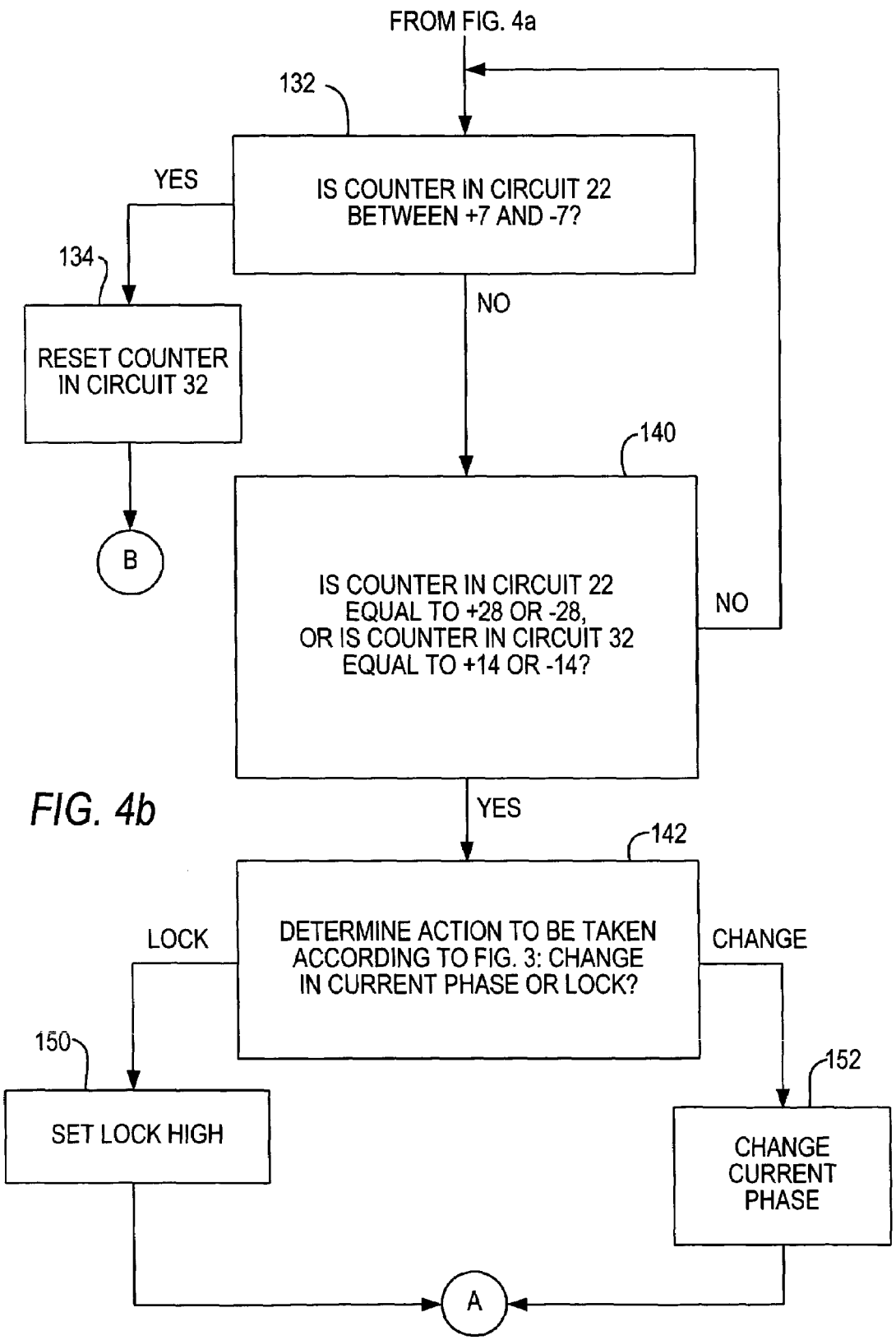

Control circuitry 40 receives all of the F UPA, F DNA, F UPB, and F DNB signals. On the basis of those signals, circuitry 40 controls multiplexer circuitry 50 to select the current phase signal and the next phase signal from among the eight candidate clock signals supplied to multiplexer circuitry 50 via leads 52. An illustrative selection control algorithm that control circuitry 40 may implement in accordance with the invention is shown in FIGS. 3 and 4a-4b.

Each horizontal line in FIG. 3 illustrates different possible conditions of the counts in circuits 22 and 32 when one or the other of those circuits reaches its threshold for outputting one of the F UPA, F DNA, F UPB, or F DNB signals. The channel with the circuit 22 or 32 thus outputting one of these signals is identified in the FIG. 3 column headed "Winner." The two left-hand columns indicate the "polarity" of the concurrent net counts in circuits 22 and 32, respectively. The right-hand column indicates the current-phase action (if any) taken or commanded by circuitry 40 in response to the conditions indicated in the first three columns. The possible, subsequent, next-phase action taken or commanded by circuitry 40 is illustrated by FIGS. 4a-4b, described later in this specification.

Considering first the first line in FIG. 3, if both of circuits 22 and 32 are registering net UP counts when either of those circuits reaches its threshold (28 or 14, respectively) for outputting an F UPA or F UPB signal, then control circuit 40 causes multiplexer 50 to select a higher phase candidate clock signal for the current phase signal. For example, if the current phase signal was Phase X and the next phase signal was Phase X+45°, the new current phase signal would be Phase X+45°. It will be apparent from this and the following discussion that to perform its function, control circuit 40 needs to receive not only signals telling it when one of circuits 22 and 32 has reached its threshold and from which direction, but also what the current state of the count in the other one of circuits 22 and 32 is. For example, the F UPA, F DNA, F UPB, and F DNB signals can include signals indicating whether the count in the associated circuit 22 and 32 is currently trending up or trending down.

The second line in FIG. 3 illustrates what may be thought of as a condition opposite that illustrated by the first line. This is a condition in which both of circuits 22 and 32 are registering net DN counts when either of those circuits reaches its threshold for outputting an F DNA or F DNB signal. When that type of condition is detected, control circuitry 40 causes multiplexer 50 to select for the current phase signal a candidate clock signal having lower phase. For example, if the current phase signal was Phase X and the next phase signal was Phase X+45°, the current phase signal would become Phase X−45°. As another example, if the current and next phase signals were Phase X+45° and Phase X, respectively, the new current phase signal would be Phase X.

The third line in FIG. 3 illustrates the following condition: Circuit 32 outputs an F DNB signal before circuit 22 reaches the count required for output of an F UPA signal. However, the net count in circuit 22 is UP. This indicates that the phase of DATAIN is between the phases of the current and next phase signals. It may additionally suggest that the phase of DATAIN is quite close to the phases of the current phase signal and farther from the phase of the next phase signal (because circuit 32 is receiving sufficiently predominant DNB pulses to reach its threshold count of 14, while circuit 22 is not receiving sufficiently predominant UPA pulses to (in the same time) reach its threshold count of 28). This further suggests that the current phase signal is already the best available choice for use in sampling DATAIN. Accordingly, control circuit 40 does not change the signal selections being made by multiplexer 50, and may in addition produce an output "LOCK" signal indicating to the circuitry making use of DPA circuitry 10 that the DPA circuitry is in a desirable, stable, "lock" condition.

The fourth line in FIG. 3 illustrates a condition somewhat like the third line condition, except that in this case circuitry 22 reaches its UP threshold (28) and outputs an F UPA signal before circuitry 32 reaches its DN threshold (14). This again indicates that DATAIN has phase between the phases of the current and next phase signals. However, it also suggests that the phase of DATAIN is closer to the phase of the next phase signal than to the phase of the current phase signal. Accordingly, control circuit 40 causes multiplexer 50 to select the next higher phase candidate clock signal for the current phase signal. For example, if current phase was Phase X and next phase was Phase X+45°, current phase becomes Phase X+45°.

The fifth line in FIG. 3 is somewhat like the third line, except that in this case the current phase signal has greater phase angle (e.g., Phase X+45°) than the next phase signal (e.g. Phase X). Circuitry 32 reaches its UP threshold (14) and outputs an F UPB signal before circuitry 22 reaches its DN threshold (28). This condition indicates that the phase of DATAIN is between the current and next phases. In addition, this condition tends to suggest that the phase of DATAIN is closer to the current phase than to the next phase. Control circuitry 40 therefore makes no change in either the current phase signal or the next phase signal, and it may also output a "LOCK" signal as described above in connection with the third line in FIG. 3.

The last line in FIG. 3 bears the same kind of relationship to the fourth line that the fifth line bears to the third line.

Again, the current phase signal has greater phase angle than the next phase signal. The phase of DATAIN is between the current phase and the next phase. However, circuit 22 reaches its DN threshold (28) and outputs an F DNA signal before circuitry 32 reaches its UP threshold (14). This suggests that the next phase signal is closer to the phase of DATAIN than the current phase. Accordingly, control circuitry 40 causes multiplexer 50 to select a new current phase signal having phase angle that is decreased relative to the previously selected current phase signal.

The above discussion of FIG. 3 covers only possible changes in the current phase signal. Whenever there is a change in the current phase, the new next phase signal is subsequently determined by the polarity of an initial subsequent count of the counter in circuitry 22. This can be done in the manner illustrated by FIGS. 4a-4b. For example, after the counters in both of circuits 22 and 32 are reset (step 112) (e.g., following a change in the current phase), the counter in circuitry 32 is held in reset and only the counter in circuitry 22 is released (step 114). Steps 120, 122, 124, and 130 show that the counter in circuitry 32 is held in reset until the counter in circuitry 22 reaches +7 or −7. If +7 is reached, next phase is selected (by element 50 in FIG. 2) as the current phase +45° (step 122). If −7 is reached, next phase is selected (by element 50 in FIG. 2) as the current phase −45° (step 124). After next phase has been selected in this manner, the counter in circuit 32 is released from reset (step 130). Using a threshold like +/−7 in the selection of next phase helps prevent next phase from switching around too much.

Once next phase has been selected, the counters in circuits 22 and 32 compete by counting to 28 and 14, respectively (step 140). The step 132 intervening between steps 130 and 140 monitors the possibility of the counter in circuitry 22 falling below +7 or above −7. If that happens, the counter in circuitry 32 is reset (step 134) and the next phase selection process is repeated by returning to step 120. Thus the threshold difference between circuits 22 and 32 is not as great as it may at first appear to be, because the counter in circuitry 22 is always given a head start of 7 before the counter in circuitry 32 is released to begin counting. The threshold difference between circuits 22 and 32 is therefore only 7, not 14 as it may superficially appear to be.

When the counter in either of circuits 22 and 32 exceeds its threshold, control passes from step 140 to step 142. This step determines the action to be taken according to FIG. 3. If the action to be taken is a change in the current phase, that is done in step 152 and control then passes back to step 112. On the other hand, if the action to be taken is "lock," that is done in step 150, after which control passes back to step 112.

It is believed desirable for the next phase threshold (e.g., 14) to be less than the current phase threshold (e.g., effectively 21, after the head start of 7 given the counter in circuitry 22 before the counter in circuitry 32 is released to begin counting as described above) because this contributes to system stability. Next phase should be farther from the phase of DATAIN than current phase. When that is the case, circuitry 32 should reach its relatively low threshold before circuitry 22 reaches its relatively high threshold, and under those conditions the system will "lock" (i.e., not change the selections of current phase and next phase). On the other hand, if circuitry 22 reaches its high threshold (effectively 21) before circuitry 32 reaches its low threshold (14), there is a need to change the current and next phase signal selections because the current phase signal is not the best one for use in controlling when the DATAIN signal is sampled. It will be appreciated, however, that it may not be necessary for circuits 22 and 32 to have precisely this difference in thresholds. Good operation may be achieved with thresholds that are farther apart, not as far apart, or even equal to one another.

It will also be understood that FIGS. 3 and 4a-4b are only illustrative of how circuitry 40 may be arranged to respond to various conditions in the circuitry upstream from circuitry 40.

Another desirable attribute of the circuitry of the invention is that its resolution tends to increase with jitter on the data. The circuit has the tendency to settle in the better of the two best phases with jitter on the data because jitter slows down the counter 22/32 that is closer to the optimal sampling point. This is illustrated by FIG. 5.

Figure 5:
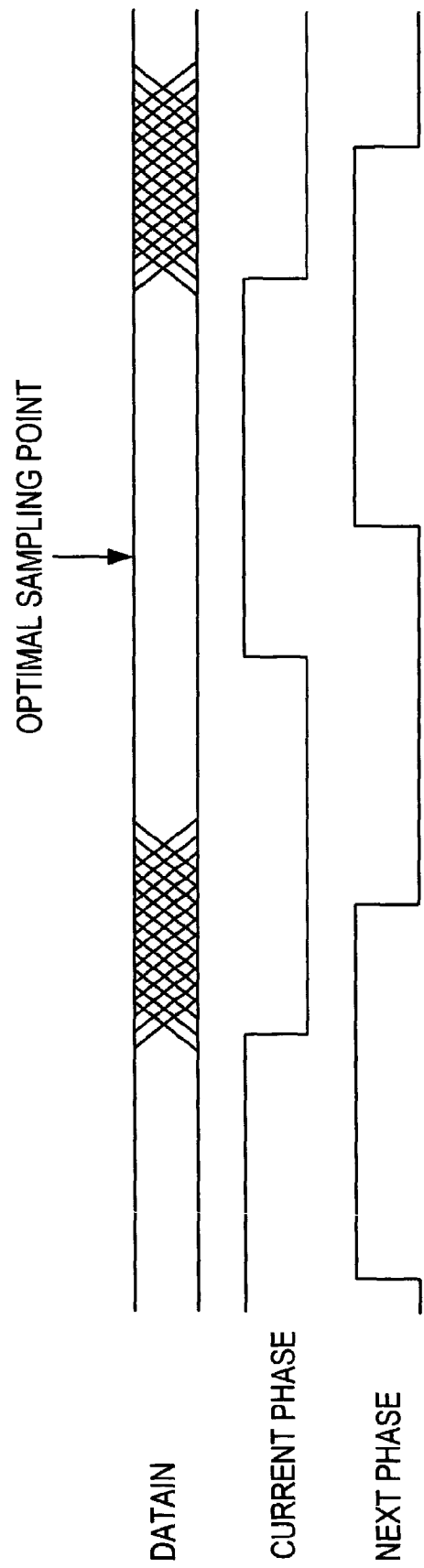
FIG. 5 shows more illustrative signal waveforms (all plotted along a common horizontal time scale) that are useful in explaining further aspects of the invention.

In FIG. 5, next phase is closer to the optimal sampling point. The next phase detector 30 will mostly be outputting DN pulses because next phase is somewhat above the optimal sampling point. However, because of the noise on the data, the next phase detector will also output some UP pulses. The closer next phase is to the sampling point, the more UP pulses will occur when compared to DN pulses. However, total DN pulses should be greater than UP pulses, assuming the jitter is distributed in a Gaussian distribution around the optimal sampling point and next phase is above the optimal sampling point. The UP pulses slow down the next phase counter 32 and make it more likely that the current phase path 20/22 will reach its threshold first, causing a switch to next phase. If the current phase is closer to the optimal sampling point, the current phase counter will be slowed down by the jitter, making the circuit more likely to lock. The end effect is that the circuit tends to settle in the phase whose falling edge is closer to the data transition point where the jitter is centered.

It will be understood that the foregoing is only illustrative of the principles of the invention, and that various modifications can be made by those skilled in the art without departing from the scope and spirit of the invention. For example, the use of eight candidate clock signals 52 is only illustrative, and a larger or smaller number of such signals can be used instead if desired. The candidate clock signals do not have to have the same frequency as the bit rate of the DATAIN signal. For example, the candidate clock signals could have a frequency that is a multiple of (e.g., two, three, or four times) the bit rate. In such cases (or indeed in any case) the current phase signal might not be used directly to control sampling of the DATAIN signal, but might instead be used as a pointer to another clock signal that is best for sampling the DATAIN signal. For example, this other clock signal could be another of the candidate clock signals having a predetermined phase shift from the current phase signal.

The invention claimed is:

1. Dynamic phase alignment circuitry comprising:
   a source of a plurality of phase-distributed clock signals;
   circuitry for selecting two, phase-adjacent ones of the clock signals that currently have transitions on respective opposite sides of transitions in a serial data signal, the circuitry separately monitoring the consistency with which each of the selected two, phase-adjacent clock signals has transitions on each side of the transitions in the serial data signal and further selecting one of the selected two clock signals based on the consistency; and
   output circuitry for outputting the further selected one clock signal for use as a basis for selecting sampling times of the serial data signal to recover data therefrom, wherein the circuitry for selecting makes no change in its clock signal selections unless a consistency measure threshold is reached for one of the selected two clock signals.

2. The circuitry defined in claim 1 wherein the circuitry for selecting employs different consistency measure thresholds for each of the selected two clock signals.

3. The circuitry defined in claim 2 wherein the circuitry for selecting employs a greater consistency measure threshold for the further selected one clock signal than for the other of the selected two clock signals.

4. The circuitry defined in claim 3 wherein as long as the circuitry for detecting detects that the transitions in the selected two clock signals are predominantly on respective opposite sides of the transitions in the serial data signal, the circuitry for detecting makes no change in its clock signal selections unless the consistency measure threshold for the further selected one clock signal is reached before the consistency measure threshold for the other of the selected two clock signals is reached.

5. The circuitry defined in claim 4 wherein as long as the circuitry for detecting detects that the transitions in the selected two clock signals are predominantly on respective opposite sides of the transitions in the serial data signal, the circuitry for detecting outputs a lock signal when the consistency measure threshold for the other of the selected two clock signals is reached before the consistency measure threshold for the further selected one clock signal is reached.

6. A method for dynamic phase alignment comprising:
selecting two phase-adjacent ones of a plurality of phase-distributed clock signals;
comparing phases of the selected two phase-adjacent clock signals to phase of a serial data signal; and
changing the selected phase-adjacent clock signals until the phases of the selected two phase-adjacent clock signals are predominantly on respective opposite sides of the phase of the serial data signal, and thereafter changing the selected phase-adjacent clock signals only if a first of those signals becomes more predominantly on one side of the phase of the serial data signal than a second of those signals by a predetermined amount.

7. The method defined in claim 6 further comprising:
selecting the first of the selected phase-adjacent clock signals as a basis for controlling timing of sampling of the serial data signal to recover data therefrom.

8. The method defined in claim 6 wherein the comparing comprises:
producing a first or second indication each time the phase of the first selected clock signal is on a first or second side of the phase of the serial data signal, respectively; and
producing a third or fourth indication each time the phase of the second selected clock signal is on a first or second side of the phase of the serial data signal, respectively.

9. The method defined in claim 8 wherein the comparing further comprises:
maintaining a first net count of the first and second indications; and
maintaining a second net count of the third and fourth indications.

10. The method defined in claim 9 wherein the comparing further comprises:
producing a fifth or sixth indication whenever the first net count equals a first threshold due to more first indications than second indications or vice versa, respectively; and
producing a seventh or eighth indication whenever the second net count equals a second threshold due to more third indications than fourth indications or vice versa, respectively.

11. The method defined in claim 10 wherein the first and second thresholds have different values.

12. The method defined in claim 11 further comprising:
selecting the first selected clock signal as a basis for controlling timing of sampling of the serial data signal to recover data therefrom.

13. The method defined in claim 12 wherein the first threshold is greater than the second threshold.

14. The method defined in claim 13 wherein the changing comprises:
responding to any of the fifth through eighth indications by then examining the net count that did not cause the fifth through eighth indication.

15. The method defined in claim 14 wherein the changing further comprises:
making a determination of whether and how to change at least one of the selected phase-adjacent clock signals based on whether the fifth through eighth indication is due to more first or third indications than second or fourth indications or vice versa, and whether the net count that did not cause the fifth through eighth indication indicates more first or third indications than second or fourth indications or vice versa.

16. The method defined in claim 15 wherein the making a determination comprises:
determining that the selected phase-adjacent clock signals should not be changed under the following conditions: (1) a seventh indication and the net count that did not cause the seventh indication indicates more second indications than first indications, or (2) an eighth indication and the net count that did not cause the eighth indication indicates more first indications than second indications.

17. The method defined in claim 16 further comprising:
producing a lock indication under the conditions specified in claim 16.

18. Dynamic phase alignment circuitry comprising:
circuitry for controllably selecting two phase-adjacent ones of a plurality of phase-distributed clock signals;
circuitry for comparing phases of the selected two phase-adjacent clock signals to phase of a serial data signal; and
circuitry responsive to the circuitry for comparing for controlling the circuitry for controllably selecting to change the selected phase-adjacent clock signals until the phases of the selected two phase-adjacent clock signals are predominantly on respective opposite sides of the phase of the serial data signal, and to thereafter change the selected phase-adjacent clock signals only if a first of those signals becomes more predominantly on one side of the phase of the serial data signal than a second of those signals by a predetermined amount.

19. The circuitry defined in claim 18 further comprising:
circuitry for selecting the first of the selected phase-adjacent clock signals as a basis for controlling timing of sampling of the serial data signal to recover data therefrom.

20. The circuitry defined in claim 18 wherein the circuitry for comparing comprises:
first and second phase detector circuitries for respectively comparing phases of the first and second selected phase-adjacent clock signals to the phase of the serial data signal.

21. The circuitry defined in claim 20 wherein each of the phase detector circuitries outputs a first or second signal each time that phase detector circuitry detects that the phase of the associated selected phase-adjacent clock signal is on a respective first or second side of the phase of the serial data signal.

22. The circuitry defined in claim 21 wherein the circuitry for comparing comprises:

first and second integrator circuitries for forming net counts of the first and second signals output by the first and second phase detector circuitries, respectively.

23. The circuitry defined in claim 22 wherein the first and second integrator circuitries have respective first and second count thresholds, wherein each of the first and second integrator circuitries produces a first trigger signal when the net count of that integrator circuitry is the result of first signals greater in number than second signals by the count threshold of that integrator circuitry, and wherein each of the first and second integrator circuitries produces a second trigger signal when the net count of that integrator circuitry is the result of second signals greater in number than first signals by the count threshold of that integrator circuitry.

24. The circuitry defined in claim 23 further comprising:

circuitry for selecting the first of the selected phase-adjacent clock signals as a basis for determining timing of sampling of the serial data signal to recover data therefrom.

25. The circuitry defined in claim 24 wherein the first count threshold is greater than the second count threshold.

26. The circuitry defined in claim 25 wherein the circuitry for controlling is responsive to the first and second trigger signals of the first and second integrator circuitries.

27. The circuitry defined in claim 26 wherein the circuitry for controlling is additionally responsive to the net counts of the first and second integrator circuitries.

28. The circuitry defined in claim 27 wherein the circuitry for controlling can change the selected phase-adjacent clock signals only in response to receipt of one of the trigger signals.

29. The circuitry defined in claim 28 wherein the circuitry for controlling responds to receipt of one of the trigger signals from one of the first and second integrator circuitries by then examining the net count of the other of the first and second integrator circuitries.

30. The circuitry defined in claim 29 wherein the circuitry for controlling determines whether and how to change at least one of the selected phase-adjacent clock signals based on which of the integrator circuitries supplied the trigger signal, whether the trigger signal is a first or second trigger signal, and whether the net count of the other integrator circuitry indicates more first signals than second signals or vice versa.

31. The circuitry defined in claim 30 wherein the circuitry for controlling does not change the selected phase-adjacent clock signals in response to receipt of a trigger signal from the second integrator circuitry under the following conditions: (1) the trigger signal from the second integrator circuitry is a first trigger signal and the net count of the first integrator circuitry indicates more second signals than first signals, or (2) the trigger signal from the second integrator circuitry is a second trigger signal and the net count of the first integrator circuitry indicates more first signals than second signals.

32. The circuitry defined in claim 31 wherein the circuitry for controlling produces a lock output signal under the conditions specified in claim 31.

* * * * *